United States Patent [19]

Kawazoe et al.

[11] 4,345,000
[45] Aug. 17, 1982

[54] TRANSPARENT ELECTRICALLY CONDUCTIVE FILM

[75] Inventors: Shozo Kawazoe; Takao Matsui; Takahiko Moriuchi, all of Osaka, Japan

[73] Assignee: Nitto Electric Industrial Co., Ltd., Osaka, Japan

[21] Appl. No.: 216,740

[22] Filed: Dec. 15, 1980

[30] Foreign Application Priority Data

Dec. 15, 1979 [JP] Japan .................................. 54-163211
Dec. 15, 1979 [JP] Japan .................................. 54-163212

[51] Int. Cl.³ .......................... B32B 7/02; B05D 5/12; B32B 5/16; B32B 15/08
[52] U.S. Cl. .................................... 428/212; 427/109; 427/124; 427/126.3; 428/218; 428/336; 428/457; 428/458; 428/697; 428/701; 428/938
[58] Field of Search ............... 428/458, 457, 480, 938, 428/212, 218, 336, 697, 701; 427/124, 109, 126.3

[56] References Cited

U.S. PATENT DOCUMENTS 4,248,687 2/1981 Fan .................... 427/109 X
4,252,841 2/1981 Kinugawa et al. .......... 427/126.3 X
4,268,575 5/1981 Shinozaki et al. .............. 428/458 X
4,277,517 7/1981 Smith, Jr. ........................ 427/109 X

OTHER PUBLICATIONS

English translation of claims of Japanese Patent Publication No. 14304/1965.
English translation of claim of Japanese Patent Publication No. 35431/1976.
English translation of claim of Japanese Patent Publication No. 37667/1976.
English translation of claim of Japanese Patent Publication No. 8137/1968.

Primary Examiner—Thomas J. Herbert, Jr.
Attorney, Agent, or Firm—Sughrue, Mion, Zinn, Macpeak & Seas

[57] ABSTRACT

A transparent electrically conductive film and processes for the production thereof are described, said film comprising a metallic oxide wherein the metallic component comprises from 60 to 95 wt % indium and from 40 to 5 wt % tin formed on the surface of a plastic base, wherein the weight ratio of the tin to the indium changes continuously from the outer surface to the inner surface in such a manner that the ratio on the inner surface of the film is appreciably lower than the average ratio of the film and the ratio on the outer surface of the film is appreciably higher than the average ratio of the film.

5 Claims, 3 Drawing Figures

ID OF THE INVENTION

This invention relates to a transparent electrically conductive film comprising indium oxide and tin oxide formed on the surface of a plastic base, and processes for production thereof.

BACKGROUND OF THE INVENTION

Films which are transparent in the visible spectrum and have electrical conductivity are generally used as a transparent electrode in new display systems, such as liquid crystal, electrochromic, and electroluminescence display systems. They are also used in transparent materials to prevent static buildup, as shielding from static electricity and electromagnetic waves, as well as for static recording.

Transparent electrically conductive films composed of a stannic oxide film or indium oxide film on a glass sheet are known, but they find only limited utility because of the low flexibility and processability of the glass base conventionally used. As an alternative, plastic-based transparent electrically conductive films have attracted increased interest because of their light weight and high flexibility, processability, and impact resistance. However, since plastic base is not heat-resistant, the new transparent electrically conductive films cannot be produced by the same method as has been used to manufacture the glass-based film.

The conventional process for the production of the glass-based film comprises the spraying of a solution of tin tetrachloride in hydrochloric acid onto a glass sheet heated to several hundred degrees Celsius, followed by oxidation at high temperature to form a thin film of stannic oxide. A recently developed method uses indium oxide as an evaporation source which is deposited as a vapor on a glass sheet (heated normally to about 300° to 350° C.) in a high degree of vacuum in the range of from $10^{-4}$ to $10^{-5}$ mmHg. Obviously, either method requires the heating of the glass base to high temperatures, as does another known method which supplies the vacuum system with water vapor or a gas that contains water vapor. The last mentioned method aims at forming an electrically conductive film of low resistivity, say 100 ohms/cm$^2$ or less, but even that method requires heating of the glass base to a temperature between 300° and 350° C. In short, the heating of the glass base is indispensable to the manufacture of a desired glass-based electrically conductive film in the conventional technique, and apparently, such technique is not applicable to the production of a thin electrically conductive film using a plastic base.

Several methods have been proposed to solve the stated problem, and most of them rely on a vacuum vapor deposition process using either indium oxide or indium as a primary evaporation source.

Examples of the method using oxide indium as an evaporation source are described in Japanese Patent Publication Nos. 35431/76 and 37667/76 wherein an indium oxide vapor is deposited on a plastic base in a high degree of vacuum (i.e., less than $1 \times 10^{-3}$ mmHg, typically between $1 \times 10^{-4}$ to $1 \times 10^{-5}$ mmHg) that was either unheated or heated to a suitable temperature tolerable to the plastic base, followed by oxidative treatment under heating primarily in an oxidizing gas atmosphere. But this method demands relatively severe conditions for the oxidation treatment that follows the vacuum deposition of oxide indium vapor; for example, the optimum temperature for heat treatment in air for a practical period is between 200° and 250° C. or higher. During vacuum deposition, indium oxide is decomposed to lower oxides, so the purpose of oxidative treatment is to convert them into higher oxides, but since the conditions for that treatment are severe, as mentioned above, only limited types of plastics can be used as the base. In addition, the method that uses an oxide as an evaporation source must heat the source to a temperature higher than 1,300° C., and typically between about 1,500° and 2,100° C. This requires the use of a heat-resistant expensive crucible as a container for the evaporation source. Furthermore, the distance by which the evaporation source is conventionally separated from the plastic base is such that there is a great possibility that the plastic base will be intensely heated by radiation, and this is another limiting factor on the material used as the plastic base.

The other method, that uses indium as an evaporation source, deposits the vapor of indium oxide on a plastic base that is formed by oxidizing indium in a vacuum system having relatively low degree of vacuum (i.e., ca. $2 \times 10^{-2}$ to $1 \times 10^{-4}$ mmHg) which is being supplied with an oxidizing gas. Japanese Patent Publication No. 14304/65 describes a method that facilitates the conversion of indium to indium oxide by heating the plastic base to at least 100° C., and typically between about 110° and 150° C., before vacuum deposition. Japanese Patent Publication No. 8137/68 describes a method wherein a thinner film of vapor deposit is provided by performing deposition at a rate higher than 16 Å/sec, typically higher than 50 Å/sec, and after the deposition, the film is held at a temperature of around 100° C. for several hours to promote the conversion of indium to an oxide form.

In these methods wherein the plastic base is not heated at all or is heated to relatively low temperatures, and wherein the temperature of the evaporation source is not great, only a small amount of heat is radiated from the evaporation source. Even the temperature at which the indium oxide film is held after its deposition is well tolerated by the various types of plastic base.

As discussed above, almost all types of plastic bases can be used in the method that uses indium as an evaporation source, and hence, the method has been considered the most desirable process for producing a transparent electrically conductive film on an industrial scale. But in spite of that great advantage, the method cannot provide an electrically conductive film having good characteristics, and in particular, its transparency is not completely satisfactory. For example, the film produced according to the method described in Japanese Patent Publication No. 14304/65 has a transmittance of visible light (600 nm) of only up to about 30%, even if it is very thin. Some improvement in transparency can be obtained in the method of Japanese Patent Publication No. 8137/68 by performing suitable treatments, such as oxidative treatment under severe conditions, but the maximum transmittance of visible light through a thick film (e.g., 1,000 Å or more) is about 80%, and a higher transmittance cannot be achieved.

SUMMARY OF THE INVENTION

An object of this invention is to provide a transparent electrically conductive film wherein the weight ratio of tin to indium in the oxide form decreases continuously from the outer surface inward in the direction of the thickness of the film.

Another object of the invention is to provide a process for producing such a transparent electrically conductive film.

In accordance with the present invention, a transparent electrically conductive film is provided comprising a metallic oxide, wherein the metallic component comprises from 60 to 95 wt% indium and from 40 to 5 wt% tin, formed on the surface of a plastic base, wherein the weight ratio of the tin to the indium changes continuously from the outer surface to the inner surface in such a manner that the ratio on the inner surface of the film is appreciably lower than the average ratio of the film and the ratio on the outer surface of the film is appreciably higher than the average ratio of the film.

Furthermore, a process for producing a transparent electrically conductive film as described above is provided, comprising preparing an evaporation source composed of from 60 to 95 wt% indium and from 40 to 5 wt% tin in a container in an amount sufficient to provide a predetermined film thickness, subjecting the evaporation source to initial heat treatment in a mixed gas atmosphere composed of a mixture of oxygen and an inert gas to evaporate at least indium, followed by subjecting the evaporation source to a subsequent heat treatment at increasing temperature, so as to provide deposition of indium and tin oxides on a plastic base at a constant rate throughout a stage of vacuum deposition, and oxidation treating the film deposited.

The transparent electrically conductive film produced by this invention can be used in various applications depending upon its transparency and conductivity (surface resistivity). Typical examples include: for liquid crystal display, a transparent electrically conductive film which is at least 80% transparent (transparency is hereunder defined as a transmittance of visible light at 600 nm (as determined by the method described in Example 1 (set forth hereinafter))) and which has an electrical conductivity (hereunder defined as the surface resistivity of the film) between about 0.1 k$\Omega$/cm$^2$ and 6 k$\Omega$/cm$^2$ is used; for prevention of static buildup and for shielding from static electricity, a transparent electrically conductive film which is at least 60% transparent and which has an electrical conductivity between about 1 k$\Omega$/cm$^2$ and 10$^5$ k$\Omega$/cm$^2$ is used; and for static recording, a transparent electrically conductive film which is at least 75% transparent and which has an electrical conductivity between about 10$^2$ k$\Omega$/cm$^2$ and 10$^4$ K$\Omega$/cm$^2$ is used.

Therefore, the transparent electrically conductive film provided by this invention generally has a transparency of at least 60%, preferably at least 75%, and has an electrical conductivity between about 0.1 k$\Omega$/cm$^2$ and 10$^5$ k$\Omega$/cm$^2$. For use as a transparent heat generating element, the film is required to be at least 60% transparent and have a conductivity between 0.01 k$\Omega$/cm$^2$ and 0.1 k$\Omega$/cm$^2$.

DETAILED DESCRIPTION OF THE INVENTION

In making the present invention, we made studies to produce a highly transparent electrically conductive film without compromising the merit of the method that uses indium as an evaporation source. As a result, we found that in the method of the type described in Japanese Patent Publication No. 8137/68 wherein vacuum deposition in an oxidizing gas atmosphere is followed by oxidative treatment, higher transparency is achieved by using a gas mixture comprising oxygen and an inert gas such as nitrogen or argon rather than oxygen alone as an oxidizing atmosphere. We have also found that a film deposited on a plastic base in a vacuum enclosure containing a suitable amount of water vapor in such oxidizing gas atmosphere can be provided with very high transparency after oxidative treatment. Surprisingly, the inclusion of water vapor permits milder conditions for the oxidative treatment and the resulting film has high transparency even if the thickness is great. Our finding is very important and is hard to expect from the existing theory. According to the established theory of vacuum vapor deposition, the presence of water vapor in a vacuum system is believed deleterious to the formation of a uniform deposited film of good quality, and much effort has been made to keep water vapor out of the vacuum system. It is true that a proposal was conventionally made to supply a vacuum system with water vapor so as to deposit a film (e.g., indium oxide) of very low surface resistivity on an intensely heated glass sheet, but even in this case, the supply of water vapor was considered detrimental to the purpose of providing a highly transparent film.

Figure 3:
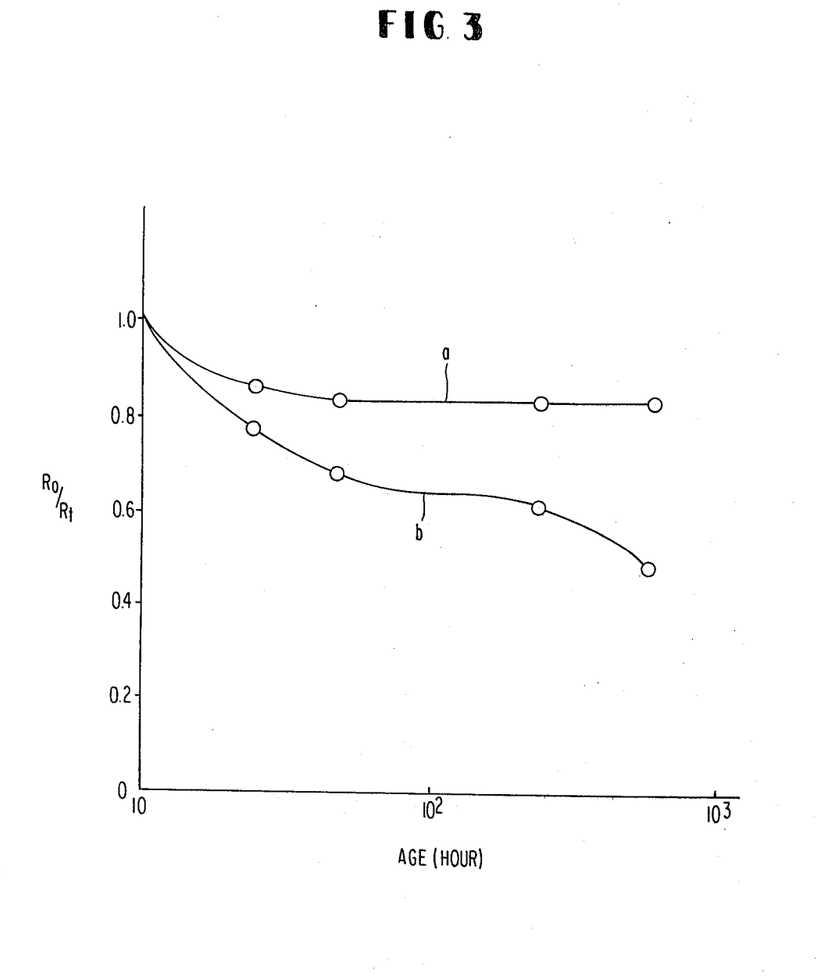
FIG. 3 is a diagram showing the time-dependent change of the surface resistivities of two different transparent electrically conductive films, wherein curve a represents a film prepared according to this invention, and curve b represents a film prepared by a method other than that of this invention.

Thus, we succeeded in providing a highly transparent electrically conductive film by using a mixture of oxygen and an inert gas as an oxidizing gas and by including water vapor in the oxidizing gas. However, even this method was not free from another defect of the conventional method that uses indium as an evaporation source, i.e., the resistivity of the transparent electrically conductive film obtained is unstable and its surface resistivity increases greatly when it is left to stand in air for an extended period of time. FIG. 3 (curve b) shows the change in the surface resistivity of a transparent electrically conductive film 300 Å thick during storage in air (dark room). The film was produced by vacuum deposition in a gas mixture containing water vapor followed by oxidative treatment. 240 hours later, the surface resistivity was about 1.7 times as great as the initial value, and 600 hours later, the resistivity was about 2.2 times the initial value, and the resistivity kept increasing thereafter. Such instability in resistivity poses a great problem when the film is used in a transparent electrode, heater or in other applications that require constant resistivity.

In our continued study to provide a transparent electrically conductive film with stability in resistivity, we used indium and a specific amount of tin as an evaporation source and produced a transparent electrically conductive film composed of oxides of the two metals by repeating the same procedure of vacuum deposition and oxidative treatment as described above except that a special means was used for the vacuum deposition. As a result, we formed an electrically conductive film wherein the weight ratio of tin to indium in the oxide form changes continuously from the outer to the inner surface of the film (i.e., high on the outer surface and low on the inner surface), and we found that such film has greatly improved stability in resistivity. It was conventionally known that the surface resistivity of a transparent electrically conductive film made of indium oxide is decreased by inclusion of a very small amount of tin oxide. However, no transparent electrically conductive film whose construction is such that the proportion of metal components changes in the direction of its thickness as above has been known, and no elucidation has been made at all of the relation between such construction and stability in resistivity.

The transparent electrically conductive film of this invention is composed of an oxide of from 60 to 95 wt% of indium and from 40 to 5 wt% of tin formed on the surface of a plastic base. The weight ratio of tin to indium (hereinafter referred to as Sn/In ratio) in the oxide form changes continuously from the outer to the inner surface of the film in such a manner that the Sn/In ratio on the inner surface of the film is appreciably lower than the average Sn/In ratio of the film whereas the Sn/In ratio on the outer surface of the film is appreciably higher than the average Sn/In ratio.

Figure 1:
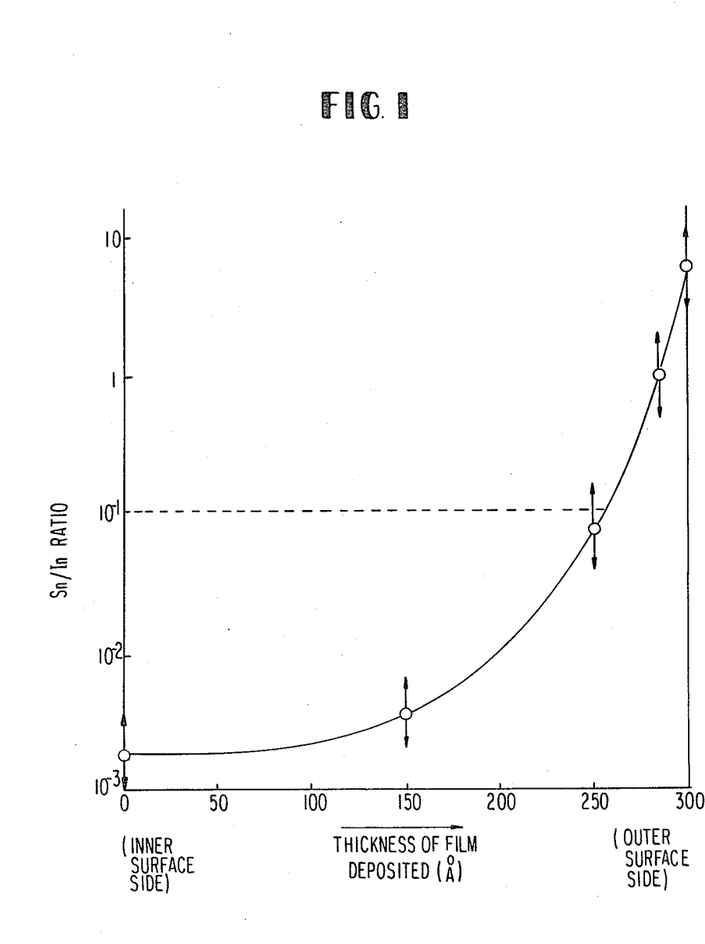
FIGS. 1 and 2 are diagrams showing different curves for the change in Sn/In ratio from the outer to the inner surface of two transparent electrically conductive films prepared according to this invention. The vertical arrows appearing at the circled points in FIGS. 1 and 2 show some scatter of experimental errors.
Figure 2:
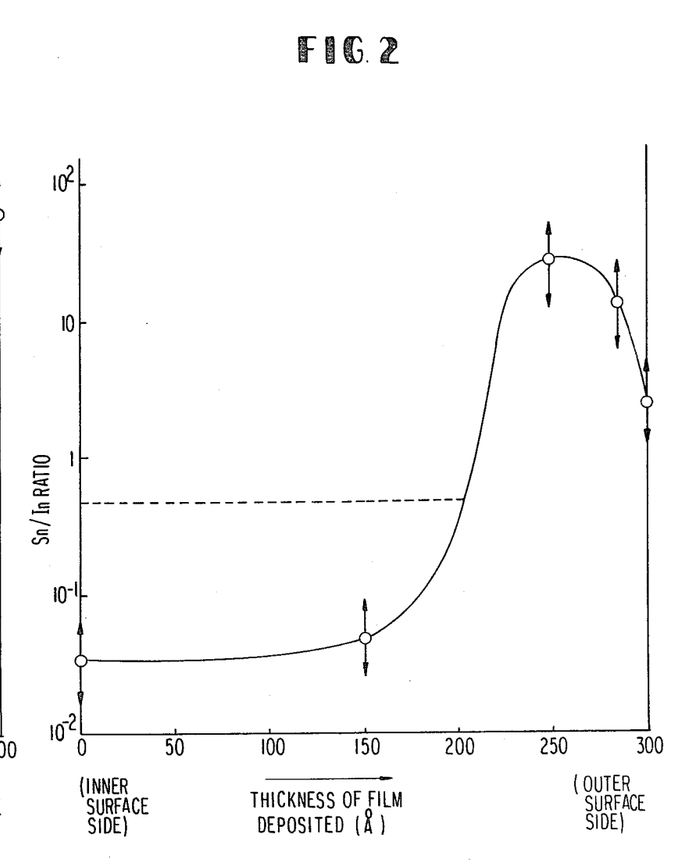

The change in the Sn/In ratio from the outer to the inner surface of two transparent electrically conductive films prepared according to this invention is shown in FIGS. 1 and 2, in each of which the Sn/In ratio is plotted on the vertical axis and the film thickness is plotted on the horizontal axis. FIG. 1 shows data for a film 300 Å thick which is composed of an oxide of 90 wt% indium and 10 wt% tin prepared according to the method of Example 2 described herein, and FIG. 2 shows a data for a film of the same thickness which is composed of an oxide of 60 wt% indium and 40 wt% tin prepared according to the method of Example 4. In both figures, the dotted line represents the average Sn/In ratio of the film. As FIGS. 1 and 2 also show, the curve representing the change in the Sn/In ratio from the outer to the inner surface of a film having one composition can differ considerably from the curve for the change in the Sn/In ratio in the direction of the thickness of a film having another composition, but such difference is not critical to the purposes of this invention. The important thing is that the Sn/In ratio continuously changes from the outer to the inner surface of the film to provide a highly concentrated indium oxide layer on the inner surface wherein the Sn/In ratio is appreciably smaller than the average Sn/In ratio of the film and provide a highly concentrated tin oxide layer on the outer surface wherein the Sn/In ratio is appreciably larger than the average Sn/In ratio of the film.

The stability of resistivity of a transparent electrically conductive film of the structure described above according to this invention is shown in FIG. 3, wherein Ro/Rt (Ro is the initial surface resistivity and Rt is the resistivity of the film left to stand for a period of t) is plotted along the vertical axis and the time of storage in air (dark room) is plotted along the horizontal axis. The curve a in the figure represents a transparent electrically conductive film of this invention that is composed of an oxide of 80 wt% indium and 20 wt% tin prepared according to the method of Example 4 to be described herein, having a thickness of 300 Å and a structure in which the change in the Sn/In ratio is similar to that represented in FIG. 1. The curve b represents a transparent electrically conductive film composed of indium oxide alone prepared according to the method of Comparative Example 1 to be described herein. As is clear from the figure, the surface resistivity of the film of this invention that is left to stand for 240 hours is only about 1.2 times the initial value and no substantial increase was observed in the subsequent period. This is perhaps because the outer layer of the film that has tin oxide in high concentration (i.e., the Sn/In ratio is appreciably higher than the average Sn/In ratio) serves as a barrier against a change in resistivity due to oxidation.

Thus, the transparent electrically conductive film of this invention achieves great stability in resistivity. Other advantages of the film are its chemical resistance and wear resistance, which is higher than a film containing no tin oxide or a film that has a uniform distribution of tin oxide throughout the thickness of the film. This also results from the presence of an outer layer that has tin oxide in high concentration. Great stability in resistivity, high chemical resistance and wear resistance can also be achieved by a film composed of an outer tin oxide layer and an inner indium oxide layer. As stated above, the transparent electrically conductive film of this invention comprises an outer layer that has tin oxide in high concentration and an inner layer that has indium oxide in high concentration, but at the same time, the Sn/In ratio of the film changes continuously along the thickness of the film. In other words, despite the great difference in Sn/In ratio between the outer and inner layers, tin oxide is contained throughout the film. Therefore, the average initial surface resistivity of the film is appreciably lower than the film containing no tin oxide or the film composed of an outer tin oxide layer and an inner indium oxide layer. In addition, the film of this invention is free from the problem of separation between layers that could occur in a film composed of an outer tin oxide and an inner indium oxide layer.

According to this invention, the weight proportions of indium and tin in the oxide form that constitute the transparent electrically conductive film are defined to be within the ranges of from 60 to 95 wt% and from 40 to 5 wt%, respectively, because the greater the proportion of tin is, the higher the stability in resistivity, but on the other hand, the film becomes less transparent and has a higher initial resistivity. If the proportion of tin is too small, no satisfactory improvement is obtained with respect to stability in resistivity, chemical resistance and wear resistance. All of the desired characteristics are obtained when the proportions of indium and tin are set within the ranges of from 60 to 95 wt% and from 40 to 5 wt%, respectively; preferably they are within the ranges of from 65 to 90 wt% and from 35 to 10 wt%, respectively.

According to a first process for producing a transparent electrically conductive film having the structure described above, an evaporation source composed of from 60 to 95 wt% indium and from 40 to 5 wt% tin is set in a container in an amount sufficient to provide a predetermined film thickness, and is subjected to an initial heat treatment in a mixed oxidizing gas atmosphere composed of a mixture of oxygen and an inert gas to evaporate at least indium, then subjecting the evaporation source to a subsequent heat treatment at an increasing temperature, so as to insure that indium and tin oxides are deposited on the plastic base at a constant rate throughout the stage of vacuum deposition, followed by oxidation of the deposited film.

According to a second process, water vapor is contained in the mixture of oxygen and an inert gas used as an oxidizing gas atmosphere in the first process.

In these processes, vacuum deposition in an oxidizing gas atmosphere using indium and tin as an evaporation source precedes further oxidation of the deposited film. Thus, compared with the method of using indium oxide and tin oxide that require higher temperatures to deposit, these processes permit the use of almost unlimited types of plastic bases (the higher the temperature required for deposition, the greater the heat of generation emitted from the evaporation source and the higher the temperature of the plastic base, the more limited the types of plastic base that can be used) and the evaporation source need only be heated to a relatively lower temperature.

None of these processes require a difficult industrial technique to perform the vacuum deposition of indium and tin, because a transparent electrically conductive film wherein the Sn/In ratio changes continuously from the outer to the inner surface can be obtained by simply increasing gradually the temperature of the evaporation source from a predetermined initial temperature using the difference in vapor pressure between the two metals. When the evaporation source is heated for a given period at an initial temperature that corresponds to a predetermined evaporation rate, an oxide that mainly consists of indium the vapor pressure of which is appreciably lower than that of tin is deposited on the surface of the plastic base. If heating is continued at the initially set temperature, the deposition rate decreases as the evaporation of indium proceeds, but if the subsequent heating is performed at a gradually increasing temperature to maintain the predetermined deposition rate, an increasing amount of tin vaporizes until a film of oxide that mainly consists of tin is deposited.

FIG. 1 shows a typical example of the change in Sn/In ratio from the outer to the inner surface that is achieved by the method described above. FIG. 2 shows a similar Sn/In ratio curve, but in FIG. 2, the Sn/In ratio reaches a peak and decreases thereafter. The reason for this is believed to be that according to deposition conditions, parts of the evaporation source is converted to oxides of higher vapor pressure by the oxidizing gas before indium and tin vaporize, and the oxides vaporize in the latter stage of heating.

In the first process, a mixture of oxygen and an inert gas is used as an oxidizing gas, so the transparent electrically conductive film obtained has a lower initial surface resistivity than that of the film produced by using only oxygen as the oxidizing gas. As mentioned before, like the film having a uniform distribution of tin oxide, the transparent electrically conductive film of this invention wherein the Sn/In ratio changes continuously from the outer to the inner surface does have a lower surface resistivity than the film composed solely of indium oxide, and this low surface resistivity can be reduced to about a tenth by using a mixture of oxygen and an inert gas. Another advantage of the gas mixture is that it provides an electrically conductive film which is more transparent than the film obtained by using oxygen alone; a relatively thin film whose thickness is about 500 Å or less that is produced by using the mixture of oxygen and an inert gas permits a transmittance of visible light (600 nm) of at least 80%.

The second process that uses a mixture of oxygen and an inert gas plus water vapor provides a transparent electrically conductive film having an even lower initial surface resistivity and even higher transparency. One great advantage of this process is that even when oxidative treatment that follows the vacuum deposition is performed under very mild conditions, a film which is as transparent as or more transparent than the film produced by the first process is obtained; even a film whose thickness is up to about 2,000 Å produced by the second process permits a transmittance of visible light of at least 80%.

The shared features of the first and second processes for preparing the transparent electrically conductive film are described collectively below. Heat considerations place substantially no limitation on the material for the plastic base used in this invention. The reasons for this are as described hereinafter, at no time during vacuum deposition is the plastic base heated to a temperature higher than 150° C., and since the evaporation source consists of indium and tin, only a slight amount of radiation heat is emitted from the evaporation source, and oxidative treatment may be performed under relatively mild conditions. Therefore, in this invention, many known plastics can be used as the substrate without any limitation. Specific examples are polyester, polyamide, polypropylene, polycarbonate, polyimide, polyparabanic acid, polyamideimide, acrylic polymer, cellulosic resin and fluorine resin. These plastics are used as a substrate in the form of a sheet, film or any other suitable forms. Prior to vacuum deposition, these plastic substrates are cleaned with a solvent or by ultrasonic waves. If necessary, the plastic bases are primed or surface-treated to provide good adhesion between the deposited film and the base and to increase the wear resistance of the base. The primer is also effective for reducing a strain that may develop in the base and deposited film during oxidative treatment.

To form the primer, a resin paint of organic solvent type, emulsion type or a solvent-free resin paint is applied to the plastic base in a predetermined thickness, followed by drying with heat, curing at room temperature or drying with electron beams or ultraviolet radiation. The resin used to form the primer includes many known resins such as epoxy resin, polyester resin, urethane resin, alkyd resin, vinyl chloride/vinyl acetate copolymer resin and acrylic resin. These resins can be applied to the plastic base by a conventional method selected from among gravure roll coating, with bar coating, doctor blade coating, reverse roll coating, dip coating, air knife coating, kiss-roll coating, nip-roll coating, and fountain-roll coating.

Various techniques for surface treatment can be used, such as corona discharge treatment, flame treatment, sputtering, irradiation with ultraviolet rays, irradiation with electron beams, chemical treatment, and treatment with an oxidizing agent.

The evaporation source used in this invention consists of indium and tin, and it may be doped with a small amount (e.g., up to about 10 wt%) of other metals such as cadmium or molybdenum. For the reasons stated before, the proportions of indium and tin are defined to be within the ranges of from 60 to 95 wt% (preferably from 65 to 90 wt%) and from 40 to 5 wt% (preferably from 35 to 10 wt%), respectively. These metals may be used as an alloy or they may be used in their respective elementary forms. They may be used in any suitable form such as a bar, film, granules, or a powder.

According to this invention, the above-described evaporation source is deposited on the plastic base in a vacuum enclosure in an atmosphere at least part of which is a mixture of oxygen and an inert gas. Typical inert gases are nitrogen and argon. These inert gases may be used individually or in combination. Alternatively, they may be used together with another inert gas such as xenon or krypton.

We have found that the proportion of the inert gas to oxygen has a great effect on the characteristics of the transparent electrically conductive film obtained, particularly its transparency. The proportion of an inert gas in the gas mixture that can be used in most cases and which is desirable for higher transparency is substantially equal to that of the inert gases in air (ca. 78–80 vol%). A typical gas mixture that meets this requirement is air, which contains nitrogen as a predominant inert gas. The first and second processes of this invention can be implemented with advantage on an industrial scale by using air. More inert gas may be contained in the gas mixture than is contained in air, but this is permitted only when the gas mixture contains water vapor, and if this is permitted, less than about 86 vol%, and preferably less than 83 vol% of an inert gas should be contained in the gas mixture. Otherwise, the transparency of the resulting film is impaired rather than improved. Two advantages of using a greater proportion of an inert gas are: it inhibits the oxidative deterioration of the boat and evacuation system during vacuum deposition, and a transparent electrically conductive film having even lower surface resistivity can be produced. These advantages are the same as the advantage achieved by using a mixture of oxygen and an inert gas plus water vapor.

Less inert gas may be contained in the gas mixture than is contained in air, and in this case, at least about 5 vol%, and preferably at least 20 vol% should be contained in the gas mixture. Otherwise, improved transparency and reduced surface resistivity cannot be achieved by any means.

To introduce water vapor into the gas mixture in the second process of this invention, the gas mixture may be passed through a container of water or an atmosphere having a given humidity. Other humidifying means can of course be used. The content of water vapor is such that the gas mixture has a relative humidity of at least about 30%, preferably at least about 70%. If the relative humidity of the gas mixture is too low, improved transparency and reduced surface resistivity can hardly be expected.

The vacuum deposition stage of the first and second processes is described specifically below. An evaporation source is set in a container in a vacuum enclosure such as a bell jar in the amount sufficient to provide a predetermined film thickness. The pressure in the bell jar is preset to about $10^{-5}$ mmHg. Then, it is supplied with the gas mixture or humidified gas mixture described above to provide a suitable degree of vacuum. The degree of vacuum in the bell jar has a great effect on the characteristics of the transparent electrically conductive film obtained and the optimum value varies depending upon whether a humidified gas or dry gas is used. If a humidified gas is used, the optimum degree of vacuum is such that the atmosphere within the bell jar is in the range of from $9 \times 10^{-2}$ to $5 \times 10^{-3}$ mmHg. Generally, if the degree of vacuum is too low, and particularly if it is less than $1 \times 10^{-1}$ mmHg, too rapid oxidation of the evaporation source often interferes with the smooth operation of vacuum deposition and results in low deposition efficiency. In addition, a deposited film having uneven surface is obtained and a transparent film is no longer achieved by the subsequent oxidative treatment. A very high degree of vacuum is not preferred because no significant improvement in transparency can be achieved by the subsequent oxidative treatment.

The evaporation source in the bell jar having a suitable degree of vacuum is vaporized by resistance heating, electron beams, induction heating or other suitable means to be condensed on the plastic base. This deposition stage consists of two steps: the initial heating step wherein the evaporation source is heated for a given period of time at an initial temperature high enough to vaporize at least indium so as to achieve the predetermined deposition rate, and the subsequent heating step wherein the temperature is gradually increased to maintain the predetermined deposition rate. For achieving high transparency, the deposition rate is generally set between 1 and 16 Å/sec. When a humidified gas is used, the optimum rate is usually between 2 and 10 Å/sec, and with this rate, the initial heating temperature is set between about 600° and 900° C.

Prior to vacuum deposition, the plastic base need not be heated, and higher transparency is achieved when the plastic base is not heated. Vacuum deposition is generally performed at a temperature up to about 150° C., preferably less than 125° C. when a humidified gas is used, and more preferably less than 100° C. (including unheated base).

The deposited film thus-obtained adheres to the surface of the plastic base to provide a uniform and strong bond. The film, which is composed of lower oxides (indium oxide and tin oxide), is dark brown and low in transparency. The film generally has a thickness between about 40 and 500 Å when the oxidizing gas mixture is dry (containing no water vapor), and has a thickness between 40 and 10,000 Å, preferably between 40 and 6,000 Å, most preferably between 60 and 2,000 Å, when the gas mixture is humidified. A thicker or thinner film may of course be produced; but if the film is too thin, a local defect is easy to develop, and if the film is too thick, the subsequent oxidative treatment must be conducted under severe conditions, e.g., high temperature and long heating period.

The deposited film is subjected to oxidative treatment to provide a transparency of at least 60%, preferably at least 80%, and most preferably at least 90%, and an electrical conductivity between about 0.01 kΩ/cm$^2$ and 10$^5$ kΩ/cm$^2$, preferably between 0.1 and 100 kΩ/cm$^2$, most preferably between 0.1 and 10 kΩ/cm$^2$. This treatment is indispensable to produce a film having improved transparency. The oxidative treatment is generally performed by heating the deposited film in an oxidizing atmosphere such as air, oxygen or ozone. Other methods may of course be employed, such as anodization, chemical oxidation, oxidation by glow, discharge, and autoclaving. Specific conditions for the oxidative treatment are determined by the use of the transparent electrically conductive film to be obtained. The following description assumes that oxidative treatment is performed by heating in air; when the film obtained is to be used in applications that do not require high transparency or electrical conductivity, short heating at low temperature is sufficient, and when a film having both high transparency and good electrical conductivity is desired, long heating at high temperature is necessary. The important consideration is that the degree of transparency and electrical conductivity required of the film determines the specific conditions for oxidative treatment.

The conditions for oxidative treatment used in this invention vary considerably depending upon whether water vapor is contained in the oxidizing gas atmosphere composed of a mixture of oxygen and an inert gas. If the gas mixture contains no water vapor, slightly severe conditions are preferably employed. If the gas mixture contains water vapor, relatively mild conditions can be selected to provide a film having a relatively wide range of thickness as defined above. For example, when heating is performed in air, a temperature of from 130° to 150° C. is generally sufficient. Of course, a temperature up to 200° C. that is tolerable to the plastic base may be selected. The heating period may be as short as from 30 to 60 minutes with the heating temperature set in the defined range. A longer period may be selected, if desired.

The transparent electrically conductive film thus-obtained has a thickness which is generally in the range of from 40 and 10,000 Å. The Sn/In ratio of the film varies continuously from the outer to the inner surface and the Sn/In ratio of the inner surface is appreciably lower than the average Sn/In ratio of the film whereas the Sn/In ratio of the outer surface is appreciably higher than the average Sn/In ratio. Generally, the film has a low surface resistivity in the range of from 0.1 to $10^5$ k$\Omega$/cm$^2$, preferably from 0.1 to 100 k$\Omega$/cm$^2$, and most preferably 0.1 to 10 k$\Omega$/cm$^2$, and has a transmittance of visible light (600 nm) of at least 60%, preferably at least 80%. In a particularly preferred embodiment, the film has a transmittance of visible light of 90% or more.

While the transparent electrically conductive film of this invention can be produced with advantage by either the first or second process, it is to be understood that the film can also be manufactured by other methods. In the first and second processes, a continuous change of the Sn/In ratio along the film thickness is achieved by using the difference in vapor pressure between indium and tin. In the third method of this invention, indium and tin are set in two separate containers and the amount of the evaporation of the two metals is varied with time by properly controlling the temperature at which they are heated.

In a fourth method that is designed to achieve continuous deposition, the plastic base is continuously moved at a suitable speed, and indium and tin set in two containers arranged in the base running direction (the container for indium is upstream of the container for tin) are simultaneously vaporized by heating. This method also provides a transparent electrically conductive film of this invention wherein the Sn/In ratio changes continuously in the direction of its thickness.

In the third and fourth methods, the oxidizing gas may be composed of a mixture of oxygen and an inert gas or the mixture may further contain water vapor as in the first and second methods, and this is advantageous for providing higher transparency and lower initial surface resistance. It is to be understood that if the film of this invention is not required to have very high transparency or very low initial surface resistivity, a fifth method which is a modification of the first, second, third and fourth processes may be employed wherein the oxidizing gas is composed of oxygen alone.

As described in the foregoing discussion, the structure of the transparent electrically conductive film of this invention is such that the Sn/In ratio varies continuously in the direction of its thickness. This structure is effective for providing much improved stability in resistivity, chemical resistance, and wear resistance. In addition, the transparency and conductivity of film produced by the first and second methods described above are particularly improved in comparison with the conventional film. The film of this invention is formed on a plastic base and takes full advantage of the high flexibility, processability, impact resistance and light weight of the base. Hence, the film can be used in a transparent electrode for a new display system and for other purposes such as preventing static buildup on transparent objects or shielding them from electromagnetic waves.

When the film of this invention is used in these applications, it may be provided with a protective coating by a known technique to further improve its wear resistance and to make it moisture resistant. The film may be subjected to further processing to provide it with adhesive property.

We have found a sixth method to produce the transparent electrically conductive film of this invention. The method is identical with the methods described above except that the oxidizing gas for vacuum deposition consists of oxygen and water vapor. Other process conditions being equal, the sixth method provides a transparent electrically conductive film whose transparency and conductivity are not quite as good as those of the film produced by the first to fourth methods. Stated in other words, if all deposition conditions except for oxidizing gas are the same, the sixth method requires severe conditions for oxidation (e.g., heat treatment) to obtain a transparent electrically conductive film of the same characteristics.

According to the sixth method, an evaporation source composed of from 60 to 95 wt% of indium and from 40 to 5 wt% of tin is vaporized and deposited on a plastic base in a vacuum enclosure supplied with an oxidizing gas atmosphere comprising oxygen and water vapor. The method uses a heterogeneous deposition means that forms a film wherein the Sn/In ratio of the film composed of indium oxide and tin oxide varies continuously from the outer to the inner surface in such a manner that the Sn/In ratio of the inner surface is appreciably lower than the average Sn/In ratio of the film and that of the outer surface is appreciably higher than the average Sn/In ratio. Then, the thus-deposited film is subjected to oxidative treatment to provide a transparent electrically conductive film.

In a particularly desirable mode of the heterogeneous deposition means, the evaporation source composed of indium and tin is set in a container in the amount necessary to give a predetermined film thickness and is subjected to an initial heat treatment to evaporate at least indium and then subjected to the subsequent heat treatment at an increasing temperature, so as to assure that indium and tin oxides are deposited at a constant rate throughout the stage of vacuum deposition.

The above-described method uses the difference in vapor pressure between indium and tin: when the evaporation source is heated for a given period at an initial temperature that corresponds to a predetermined evaporation rate, an oxide that mainly consists of indium the vapor pressure of which is appreciably lower than that of tin is deposited on the surface of the plastic base. If heating is continued at the initially set temperature, the deposition rate decreases as the evaporation of indium proceeds, but if the subsequent heating is performed at a gradually increasing temperature to maintain the predetermined deposition rate, an increasing amount of tin vaporizes until a film of oxide that mainly consists of tin is deposited.

Other heterogeneous deposition techniques may of course be used. According to one example, indium and tin are set in two separate containers and the amount of the evaporation of the two metals is varied with time by properly controlling the temperature at which they are heated. In another example which is designed to achieve continuous deposition, the plastic base is run at a suitable speed, and indium and tin set in two containers arranged in the base running direction (the container for indium is upstream of the container for tin) are simultaneously vaporized by heating. But these modifications are not as simple as the technique using the difference in vapor pressure between indium and tin, so the following description of the sixth method assumes the use of this simplest technique, but it is to be understood that the following description applies, with necessary changes having been made, to the case where the modifications of that technique are employed.

There is substantially no limitation on the material for the plastic base that can be used in this invention. The reasons are: as described hereinafter, at no time during vacuum deposition is the plastic base heated to a temperature higher than 100° C., and since the evaporation source consists of indium and tin, only a slight amount of radiation heat is emitted from the evaporation source, and oxidative treatment may be performed under relatively mild conditions. Therefore, in this invention, many known plastics can be used as the substrate without any limitation. For specific examples of the plastic base, see the examples given in connection with the description of the first and second methods. For the mode of the plastic base used, as well as for the cleaning procedure, primer coating and surface treatment that are performed prior to vacuum deposition, also see the description made in connection with the discussion of the first and second methods.

As in the previously described methods, the evaporation source used in the sixth method consists of indium and tin, and it may be doped with a small amount of other metals such as cadmium or molybdenum. The proportions of indium and tin are defined to be within the ranges of from 60 to 95 wt% (preferably from 65 to 90 wt%) and from 40 to 5 wt% (preferably from 35 to 10 wt%), respectively. If the content of tin is less than 5 wt%, a transparent electrically conductive film having stability in resistivity is not obtained, and if the tin content is more than 40 wt%, a film having high transparency is not achieved. These metals may be used as an alloy or they may be used in their respective elementary forms. They may be used in any suitable form such as a bar, film, granules or a powder.

In the sixth process of this invention, the above-defined evaporation source is deposited on the plastic base in a vacuum enclosure supplied with an oxidizing atmosphere composed of oxygen and water vapor. As described before, when the oxidizing gas in a vacuum enclosure consists of only oxygen and contains no water vapor, a film having significantly improved transparency is not produced even if the deposited film is subjected to the subsequent oxidative treatment. In contrast, an oxidizing gas that contains water vapor provides a film whose transparency can be improved greatly by the subsequent oxidative treatment even if the gas consists of only oxygen.

To introduce water vapor into oxygen in the sixth process of this invention, oxygen gas may be passed through a water container or an atmosphere having a given humidity. Other humidifying means can of course be used. The content of water vapor is such that the oxidizing gas has a relative humidity of at least about 30%, preferably at least about 50%. If the relative humidity of the oxidizing gas is too low, the object of this invention or improved transparency resulting from oxidative treatment can hardly be expected, or an oxidative treatment must be performed under relatively severe conditions, e.g., at 200° C. or more in air.

The vacuum deposition stage of the sixth process is described specifically below. An evaporation source is set in a container in a vacuum enclosure such as a bell jar in the amount necessary to give a predetermined film thickness. The pressure in the bell jar is preset to about $10^{-5}$ mmHg. Then, it is supplied with the humidified gas described above to provide a suitable degree of vacuum. The degree of vacuum in the bell jar has a great effect on the characteristics of the transparent electrically conductive film obtained. The optimum degree of vacuum is such that the atmosphere within the bell jar is in the range of from $5 \times 10^{-1}$ to $5 \times 10^{-3}$ mmHg. If the degree of vacuum is too low, and particularly if it is less than $5 \times 10^{-1}$ mmHg, too rapid oxidation of the evaporation source often interferes with the smooth operation of vacuum deposition and results in low deposition efficiency. In addition, a deposited film having uneven surface is obtained and a transparent film is no longer achieved by the subsequent oxidative treatment. A very high degree of vacuum is not preferred because no significant improvement in transparency can be achieved by the subsequent oxidative treatment.

Then, the evaporation source in the bell jar having a suitable degree of vacuum is vaporized by resistance heating, electron beams, induction heating or other suitable means to be condensed on the plastic base. This deposition stage consists of two steps: the initial heating step wherein the evaporation source is heated for a given period of time at an initial temperature high enough to vaporize at least indium so as to achieve the predetermined deposition rate, and the subsequent heating step wherein the temperature is gradually increased to maintain the predetermined deposition rate. The deposition rate is generally set between 1 and 16 Å/sec. A higher deposition rate may be selected, if desired. In a particularly advantageous mode, a rate between 2 and 10 Å/sec is selected, and with this rate, the initial heating temperature is set between about 600° and 900° C.

Prior to vacuum deposition, the plastic base need not be heated. As is demonstrated in the Examples hereinafter, the heating of the base has an adverse, rather than good, effect on the purpose of providing higher transparency. Therefore, if there is the possibility that the plastic base is heated to some extent by the heat of radiation from the evaporation source, for example, if the distance between the base and the evaporation source is very small, the base is desirably cooled by a chill roll or other simple means. But the intended transparency is achieved if the temperature to which the base is heated is not more than 100° C. The sixth process can be performed with reasonable results if the base is not heated to a temperature higher than 100° C., preferably no higher than 80° C.

The deposited film thus-obtained adheres to the surface of the plastic base to provide a uniform and strong bond. The film which is composed of lower oxides (indium oxide and tin oxide) is dark brown and low in transparency. The film generally has a thickness between about 60 and 2,000 Å. A thicker or thinner film may of course be produced, if desired. A thin film permits the use of milder conditions for oxidative treatment and is effective for providing higher transmittance of visible light and surface resistivity after oxidative treatment. A thick film is effective for providing lower surface resistivity. If the film is too thin, a local defect can easily develop, and if the film is too thick, the subsequent oxidative treatment must be conducted under severe conditions, e.g., high temperature and long heating period.

Then, the deposited film is subjected to oxidative treatment. This treatment is indispensable for water vapor included within the oxidizing atmosphere to achieve the intended effect of providing a film having greatly improved transparency. The mechanism by which water vapor aids in achieving great improvement in transparency is yet to be elucidated. For the specific means of oxidative treatment, see the description made in connection with the first and second methods.

It is not necessary to use severe conditions for the oxidative treatment performed in the sixth process. If it is achieved by heating in air, a temperature up to about 200° C. is sufficient. To provide a relatively thick film, heating in air at from 150° to 200° C. is preferred. To provide a thin film, a lower temperature, e.g., a temperature between 130° and 150° C., is preferred. The heating period may be as short as 30 to 60 minutes with the heating temperature set in the defined range. A longer period may be selected if desired.

The transparent electrically conductive film thus-obtained is such that the Sn/In ratio of the film varies continuously from the outer to the inner surface and the Sn/In ratio of the inner surface is appreciably lower than the average Sn/In ratio of the film whereas the Sn/In ratio of the outer surface is appreciably higher than the average Sn/In ratio. Such a structure is effective for providing a film having significantly improved stability in surface resistivity, as well as for achieving improved wear resistance and chemical resistance.

The transparent electrically conductive film generally has an initial surface resistivity between about 0.5 and 15 $k\Omega/cm^2$. A relatively thick film (i.e., ca. 500 to 2,000 Å) generally has a transmittance of visible light (600 nm) of at least 60%, preferably at least 70%, and typically about 80%. A relatively thin film (i.e., 60 to 500 Å) generally has a transmittance of at least 75%, typically at least 80%, and most preferably 90 to 100%. Thus, the film of this invention has much better transparency than the conventional one. A film thinner than 60 Å can have even higher transmittance and surface resistivity whereas a film thicker than 2,000 Å can have even lower surface resistivity.

As described above, the film produced by the sixth method is formed on a plastic base and takes full advantage of the high flexibility, processability, impact resistance and light weight of the base. Hence, the film can be used in a transparent electrode for a display system and in other applications that require high transparency and stability in resistivity. The film can also be used for other purposes such as preventing static buildup on transparent objects or shielding them from electromagnetic waves.

This invention is now described in greater detail by reference to the following examples which are given for here illustrative purposes only and are by no means intended to limit the scope of the invention.

EXAMPLE 1

A bell jar evacuated to $1 \times 10^{-5}$ mmHg was supplied with a dry gas mixture consisting of 20 vol% of oxygen and 80 vol% of argon until the degree of vacuum was $2.0 \times 10^{-2}$ mmHg. An evaporation source (0.02 g) composed of indium and tin (10 wt%) in a tungsten boat was heated at about 800° C. by resistance heating to deposit a film at a rate of 6 Å/sec on a polyester film 100μ thick positioned about 9 cm away from the evaporation source. Then, the remaining part of the evaporation source was deposited on the polyester film by gradually increasing the temperature to about 1,100° C. as to maintain the deposition rate of 6 Å/sec. The deposited film was 300 Å thick, dark brown and opaque. The film had a surface resistivity of 1 $k\Omega/cm^2$ and a transmittance of visible light (600 nm) of 6%. The transmittance of visible light was measured by placing in a compensation optical path a polyester film having no deposited film thereon, and this method was used to measure the transmittance of visible light through all the films prepared in the following examples.

The deposited film thus-obtained was heated at 200° C. in air for 30 minutes to obtain a sample of the transparent electrically conductive film of this invention. The film had a surface resistivity of 1.2 $k\Omega/cm^2$ and a transmittance of visible light of 90%. After storage in air (dark room) for 10 days, the film had a surface resistivity of 1.4 $k\Omega/cm^2$ and the Ro/Rt (Ro is the initial value and Rt is the value after storage) was 0.83.

The film having the characteristics described above was etched by sputtering and the contents of indium and tin from the outer to the inner surface were checked by electron spectroscopy for chemical analysis (hereunder ESCA) to know the change in Sn/In ratio in the direction of thickness. The results were virtually the same as shown in FIG. 1.

In another experiment, the deposited film was oxidized by heating at 130° C. for 60 minutes and at 150° C. for 60 minutes. The so treated film had a surface resistivity of 0.7 $k\Omega/cm^2$ and a transmittance of visible light of 37% (130° C., 60 min) and 60% (150° C., 60 min). This indicates that a film deposited in a vacuum enclosure containing no water vapor cannot be provided with high transparency by oxidative treatment under relatively mild conditions.

EXAMPLE 2

A bell jar evacuated to $1 \times 10^{-5}$ mmHg was supplied with a wet gas mixture (RH 95%) consisting of 20 vol% of oxygen and 80 vol% of argon until the degree of vacuum was $2.0 \times 10^{-2}$ mmHg. An evaporation source (0.02 g) composed of indium and tin (10 wt%) in a tungsten boat was heated at about 800° C. by resistance heating to deposit a film at a rate of 6 Å/sec on a polyester film 100μ thick positioned about 9 cm away from the evaporation source. Then, the remaining part of the evaporation source was deposited on the polyester film by gradually increasing the temperature to about 1,100° C. so as to maintain the deposition rate of 6 Å/sec. The deposited film was 300 Å thick, dark brown and opaque. The film had a surface resistivity of 2.9 $k\Omega/cm^2$ and a transmittance of visible light of 25%.

The deposited film thus obtained was heated at 150° C. in air for 60 minutes to obtain a sample of the transparent electrically conductive film of this invention.

The film had a surface resistivity of 1.5 kΩ/cm² and a transmittance of visible light of 97%. After storage in air (dark room) for 10 days, the film had a surface resistivity of 1.8 kΩ/cm² and the Ro/Rt was 0.83. The change in Sn/In ratio from the outer to the inner surface of the film having the characteristics described above was checked by ESCA as in Example 1. The results were the same as depicted in FIG. 1.

EXAMPLE 3

Five transparent electrically conductive films were prepared by repeating the procedure of Example 2 except that the oxidation conditions were 130° C.×30 min, 130° C.×60 min, 150° C.×30 min, 200° C.×30 min and 200° C.×60 min. These films had surface resistivities of 1.3 kΩ/cm², 1.3 kΩ/cm², 1.3 kΩ/cm², 1.2 kΩ/cm² and 1.2 kΩ/cm², and transmittances of visible light of 87%, 88%, 95%, 99% and 99%, respectively. After storage in air (dark room) for 10 days, the Ro/Rt of all films was substantially the same as in Example 2.

EXAMPLE 4

Three transparent electrically conductive films were prepared by repeating the procedure of Example 2 except that the content of tin in evaporation sources composed of indium and tin was varied as indicated in Table 1 below. The surface resistivities, transmittances of visible light of these films and Ro/Rt of the films after storage in air (dark room) for 10 days were as indicated in Table 1.

TABLE 1

| Content of Tin (%) | Surface Resistivity (kΩ/cm²) | Transmittance of Visible Light (%) | Ro/Rt |
|---|---|---|---|
| 5 | 3.2 | 97 | 0.72 |
| 20 | 2.8 | 96 | 0.84 |
| 40 | 10 | 85 | 0.92 |

The film prepared from an evaporation source containing 20 wt% of tin was checked for the relation between Ro/Rt and the ageing period. The results were as indicated by curve a in FIG. 3. The change in Sn/In ratio from the outer to the inner surface of the film prepared from an evaporation source containing 40 wt% of tin was checked by ESCA, and the results were as indicated in FIG. 2.

COMPARATIVE EXAMPLE 1

A transparent electrically conductive film was prepared by repeating the procedure of Example 2 except that the evaporation source was composed of indium alone. The film had a surface resistivity of 6 kΩ/cm² and a transmittance of visible light of 98%. The time-dependent change in the surface resistivity was checked by leaving the film in air (dark room), and the Ro/Rt was as shown by curve b in FIG. 1. The surface resistivity of the film stored for 10 days was 9.8 kΩ/cm² and the Ro/Rt for that film was 0.61.

EXAMPLE 5

The proportion of argon in the gas mixture used in Example 2 was varied to know the relation of the argon content with the surface resistivity and transmittance of visible light of each transparent electrically conductive film obtained. The results were as indicated in Table 2 below. As the table shows, particularly good results were obtained when the volume proportion of argon was substantially equal to that of inert gases in air (ca. 78 to 80 vol%). Even if other proportions were used, films having good transparency and low surface resistivity were obtained when the argon content was less than about 86 vol% or more than about 5 vol%.

TABLE 2

| Argon (vol %) | Surface Resistivity (kΩ/cm²) | Transmittance of Visible Light (%) |
|---|---|---|
| 95 | 1.0 | 20 |
| 90 | 0.45 | 60 |
| 86 | 0.8 | 85 |
| 83 | 1.1 | 90 |
| 79* | 1.5 | 98 |
| 70 | 2.0 | 99 |
| 50 | 2.0 | 100 |
| 20 | 3.0 | 95 |
| 5 | 6.0 | 90 |
| 0 | 11.0 | 83 |

*This value equals the volume proportion of inert gases in air.

EXAMPLE 6

A transparent electrically conductive film was prepared by repeating the procedure of Example 2 except that the wet gas (RH 95%) composed of oxygen and argon was replaced by a wet gas of the same relative humidity composed of 21 vol% of oxygen and 79 vol% of nitrogen. The film had a surface resistivity of 1.6 kΩ/cm² and a transmittance of visible light of 98%. The surface resistivity of the film stored in air (dark room) for 10 days was 1.9 kΩ/cm², and the Ro/Rt was 0.83. The change in Sn/In ratio from the outer to the inner surface of the film was checked by ESCA, and the results were substantially the same as obtained in Example 2.

EXAMPLE 7

A transparent electrically conductive film was produced by repeating the procedure of Example 6 except that the oxidation conditions were 130° C.×60 minutes. The film had a surface resistivity of 1.2 kΩ/cm² and a transmittance of visible light of 88%. The time-dependent change of the surface resistivity was substantially the same as in Example 6.

EXAMPLE 8

The proportion of nitrogen in the gas mixture used in Example 6 was varied to know the relation of the nitrogen content with the surface resistivity and transmittance of visible light of each transparent electrically conductive film obtained. The results were as indicated in Table 3 below.

TABLE 3

| Nitrogen (vol %) | Surface Resistivity (kΩ/cm²) | Transmittance of Visible Light (%) |
|---|---|---|
| 95 | 0.8 | 20 |
| 86 | 0.65 | 85 |
| 83 | 1.6 | 90 |
| 79* | 1.6 | 98 |
| 50 | 2.2 | 95 |
| 5 | 6.0 | 90 |
| 0 | 11.0 | 83 |

*The gas mixture was air.

As the table shows, particularly high transparency was achieved when the volume proportion of nitrogen was substantially equal to that of inert gases in air. Even if other proportions were used, films having good transparency and low surface resistivity were obtained when the nitrogen content was less than 86 vol% or more than 5 vol%.

EXAMPLE 9

The degree of vacuum of the atmosphere used in vacuum deposition in Example 2 was varied to know the relation of the degree of vacuum with the surface resistivity and transmittance of visible light of each transparent electrically conductive film obtained. The results were as shown in Table 4 below. As the table shows, particularly good results are obtained when the atmosphere of a vacuum enclosure that contains water vapor has a pressure of from $9 \times 10^{-2}$ to $5 \times 10^{-3}$ mmHg.

TABLE 4

| Pressure of Atmosphere (mmHg) | Surface Resistivity (kΩ/cm²) | Transmittance of Visible Light (%) |
| --- | --- | --- |
| $1 \times 10^{-3}$ | 0.6 | 28 |
| $5 \times 10^{-3}$ | 0.7 | 84 |
| $8 \times 10^{-3}$ | 0.8 | 85 |
| $1 \times 10^{-2}$ | 1.0 | 86 |
| $2 \times 10^{-2}$ | 1.5 | 98 |
| $5 \times 10^{-2}$ | 2.5 | 100 |
| $9 \times 10^{-2}$ | 7.5 | 85 |
| $1 \times 10^{-1}$ | 9.0 | 70 |

EXAMPLE 10

The relative humidity of the atmosphere used in vacuum deposition in Example 2 was varied to know the relation of the relative humidity with the surface resistivity and transmittance of visible light of each transparent electrically conductive film obtained. The results were as shown in Table 5 below. As the table shows, good results are obtained when the atmosphere of a vacuum enclosure that contains water vapor has a relative humidity of at least about 30%, and particularly good results are obtained when the relative humidity is at least about 70%.

TABLE 5

| RH (%) | Surface Resistivity (kΩ/cm²) | Transmittance of Visible Light (%) |
| --- | --- | --- |
| 15 | 0.75 | 76 |
| 30 | 1.0 | 85 |
| 60 | 1.1 | 88 |
| 70 | 1.4 | 90 |
| 95 | 1.5 | 98 |

EXAMPLE 11

The procedure of Example 2 was repeated except that the polyester film used as the plastic base in the vacuum deposition of evaporation source composed of indium and tin was heated at various temperatures to know the relation of the temperature at which the base was heated with the surface resistivity and transmittance of visible light of each transparent electrically conductive film obtained. The results were as indicated in Table 6 below. The heating means was a ceramic heater, and the temperature was measured with a thermolabel and a thermocouple. The "unheated" in the table indicates Example 2 wherein the temperature of the base was about 35° C.

TABLE 6

| Temperature of Base (°C.) | Surface Resistivity (kΩ/cm²) | Transmittance of Visible Light (%) |
| --- | --- | --- |
| unheated | 1.5 | 98 |
| 50 | 1.7 | 95 |
| 100 | 1.5 | 90 |
| 125 | 1.5 | 81 |
| 150 | 1.4 | 78 |
| 200 | 1.5 | 63 |

As the table shows, the plastic base had better not be heated in this invention, and if it is heated, it is heated to a temperature less than 125° C., preferably less than 100° C.

EXAMPLE 12

The procedure of Example 2 was repeated except that with the thickness of deposited film held at 300 Å, the deposition rate, hence the temperature at which the evaporation source was initially heated and the temperature at which the source was heated in the final stage of deposition were changed to know the relation of the deposition rate with the surface resistivity and transmittance of visible light of each transparent electrically conductive film obtained. The results were as shown in Table 7 below. The change in Sn/In ratio from the outer to the inner surface of each film was checked by ESCA, and the results were close to those obtained in Example 2.

TABLE 7

| Deposition Rate (Å/sec) | Surface Resistivity (kΩ/cm²) | Transmittance of Visible Light (%) |
| --- | --- | --- |
| 1 | 2.2 | 75 |
| 2 | 2.0 | 84 |
| 3 | 1.7 | 90 |
| 5 | 1.6 | 96 |
| 6 | 1.5 | 98 |
| 7 | 1.2 | 97 |
| 8 | 1.0 | 93 |
| 9 | 0.94 | 90 |
| 10 | 0.8 | 85 |
| 12 | 0.6 | 75 |

EXAMPLE 13

The procedure of Example 2 was repeated except that with the deposition rate held at 6 Å/sec. different amounts of the evaporation source were fed to deposit films in various thicknesses so as to know the relation of the film thickness with the surface resistivity and transmittance of visible light of each film obtained. The results were as indicated in Table 8 below. The change in Sn/In ratio from the outer to the inner surface of each film was checked by ESCA, and the results were similar to those obtained in Example 2.

TABLE 8

| Film Thickness (Å) | Surface Resistivity (kΩ/cm²) | Transmittance of Visible Light (%) |
| --- | --- | --- |
| 40 | $10^5$ | 100 |
| 60 | 60 | 100 |
| 100 | 15 | 99 |
| 350 | 1.6 | 98 |
| 650 | 1.5 | 95 |
| 1,000 | 1.4 | 92 |
| 1,500 | 1.0 | 85 |
| 2,000 | 0.8 | 80 |

TABLE 8-continued

| Film Thickness (Å) | Surface Resistivity (kΩ/cm$^2$) | Transmittance of Visible Light (%) |
| --- | --- | --- |
| 3,000 | 0.4 | 70 |

EXAMPLE 14

A film of indium oxide and tin oxide was deposited on a polyester film by repeating the procedure of Example 2 except that the deposition rate was 3 Å/sec, the evaporation source was initially heated at about 700° C. and finally heated at about 1,000° C., and 0.066 g of the evaporation source was supplied to deposit a film having a thickness of 1,000 Å. The film had a surface resistivity of 2 kΩ/cm$^2$ and a transmittance of visible light of 6%. The film was then subjected to oxidative treatment under the same conditions as used in Example 2 to produce a sample of the transparent electrically conductive film of this invention. The film had a surface resistivity of 1 kΩ/cm$^2$ and a transmittance of visible light was 92%. The surface resistivity of the film stored in air (dark room) for 10 days was 1.2 kΩ/cm$^2$ and Ro/Rt for that film was 0.82. The change in Sn/In ratio from the outer to the inner surface was determined by ESCA, and the results were substantially the same as the data obtained in Example 2.

EXAMPLE 15

Two samples of a transparent electrically conductive film were prepared by repeating the procedure of Example 14 except that the conditions for oxidative treatment were 130° C.×60 min and 200° C.×60 min. The films had surface resistivities of 1.3 kΩ/cm$^2$ and 1 kΩ/cm$^2$ and transmittances of visible light of 80% and 97%, respectively. The Ro/Rt of the respective films stored in air (dark room) for 10 days was 0.83 and 0.84.

COMPARATIVE EXAMPLE 2

A transparent electrically conductive film was prepared by repeating the procedure of Example 14 except that the evaporation source was composed of indium alone. The film had a surface resistivity of 5 kΩ/cm$^2$ and a transmittance of visible light of 96%. When the film was stored in air (dark room) for 10 days, the surface resistivity was 8.3 kΩ/cm$^2$ and the Ro/Rt for that film was 0.6.

EXAMPLE 16

A bell jar evacuated to $1\times10^{-5}$ mmHg was supplied with wet oxygen gas (RH 95%) until the degree of vacuum was $3.0\times10^{-2}$ mmHg. An evaporation source (0.02 g) composed of indium and tin (10 wt%) in a tungsten boat was heated at about 800° C. by resistance heating to deposit a film at rate of 6 Å/sec on a polyester film 100μ thick positioned about 9 cm away from the evaporation source. Then, the remaining part of the evaporation source was deposited on the polyester film by gradually increasing the temperature to about 1,100° C. so as to maintain the deposition rate of 6 Å/sec. The deposited film was 300 Å thick and had a surface resistivity of $2\times10^3$ kΩ/cm$^2$ and a transmittance of visible light of 74% (at 600 nm).

The deposited film thus-obtained was heated at 130° C. in air for 60 minutes to obtain a sample of the transparent electrically conductive film of this invention. The film had a surface resistivity of 150 kΩ/cm$^2$ and a transmittance of visible light of 82%. After storage in air (dark room) for 10 days, the film had a surface resistivity of 185 kΩ/cm$^2$ and the Ro/Rt was 0.81.

The film having the characteristics described above was etched by sputtering and the contents of indium and tin from the outer to the inner surface were checked by ESCA. The results were virtually the same as shown in FIG. 1.

EXAMPLE 17

A sample of the transparent electrically conductive film of this invention was produced by repeating the procedure of Example 16 except that the conditions for oxidative treatment were 150° C.×60 min. The film had a surface resistivity of 11 kΩ/cm$^2$ and a transmittance of visible light of 90%. After storage in air (dark room) for 10 days, the film had a surface resistivity of 13.5 kΩ/cm$^2$ and the Ro/Rt was 0.81.

EXAMPLE 18

A sample of the transparent electrically conductive film of this invention was produced by repeating the procedure of Example 17 except that the content of tin in evaporation source composed of indium and tin was 20 wt%. The film had a surface resistivity of 18 kΩ/cm$^2$ and a transmittance of visible light of 87%. The time-dependent change in the surface resistivity was checked by leaving the film in air (dark room), and the Ro/Rt was as shown by curve a in FIG. 3. The surface resistivity of the film stored for 10 days was 22 kΩ/cm$^2$ and the Ro/Rt for that film was 0.83. The change in Sn/In ratio from the outer to the inner surface was determined by ESCA, and the results were as shown in FIG. 1.

COMPARATIVE EXAMPLE 3

A transparent electrically conductive film was prepared by repeating the procedure of Example 2 except that the evaporation source was composed of indium. The film had a surface resistivity of 42 kΩ/cm$^2$ and a transmittance of visible light of 90%. The time-dependent change in the surface resistivity was checked by leaving the film in air (dark room), and the Ro/Rt was as shown by curve b in FIG. 3. The surface resistivity of the film stored for 10 days was 69 kΩ/cm$^2$ and the Ro/Rt for that film was 0.61.

EXAMPLE 19

Four transparent electrically conductive films were prepared by repeating the procedure of Example 16 except that the oxidation conditions were 150° C.×30 min, 150° C.×120 min, 200° C.×30 min and 200° C.×60 min. These films had surface resistivities of 12 kΩ/cm$^2$, 11 kΩ/cm$^2$, 17 kΩ/cm$^2$ and 16 kΩ/cm$^2$, and transmittances of visible light of 89%, 90%, 97% and 97%, respectively. After storage in air (dark room) for 10 days, the Ro/Rt of all films was substantially the same as in Example 17.

EXAMPLE 20

The degree of vacuum of the atmosphere used in vacuum deposition in Example 17 was varied to know the relation of the degree of vacuum with the surface resistivity and transmittance of visible light of each transparent electrically conductive film obtained. The results were as shown in Table 9 below. As the table shows, particularly good results are obtained when the atmosphere of a vacuum enclosure has a pressure between $5 \times 10^{-1}$ and $5 \times 10^{-3}$ mmHg.

TABLE 9

| Pressure of Atmosphere (mmHg) | Surface Resistivity (kΩ/cm²) | Transmittance of Visible Light (%) |
|---|---|---|
| $1 \times 10^{-3}$ | 1.8 | 50 |
| $5 \times 10^{-3}$ | 1.8 | 75 |
| $1 \times 10^{-2}$ | 2.2 | 80 |
| $3 \times 10^{-2}$ | 11 | 90 |
| $5 \times 10^{-2}$ | $8 \times 10^3$ | 98 |
| $9 \times 10^{-2}$ | $2 \times 10^4$ | 100 |
| $3 \times 10^{-1}$ | $5 \times 10^4$ | 85 |
| $5 \times 10^{-1}$ | $7 \times 10^4$ | 75 |

EXAMPLE 21

The relative humidity of the atmosphere used in vacuum deposition in Example 17 was varied to know the relation of the relative humidity with the surface resistivity and transmittance of visible light of each transparent electrically conductive film obtained. The results were as shown in Table 10 below. As the table shows, good results are obtained when the atmosphere of a vacuum enclosure has a relative humidity of at least about 30%, and particularly good results are obtained when the relative humidity is at least about 50%.

TABLE 10

| RH (%) | Surface Resistivity (kΩ/cm²) | Transmittance of Visible Light (%) |
|---|---|---|
| 16 | 23 | 72 |
| 30 | 20 | 75 |
| 57 | 16 | 83 |
| 75 | 13 | 86 |
| 85 | 12 | 87 |
| 95 | 11 | 90 |

EXAMPLE 22

The procedure of Example 17 was repeated except that the polyester film used as the plastic base in the vacuum deposition of evaporation source composed of indium and tin was heated at various temperatures to know the relation of the temperature at which the base was heated with the surface resistivity and transmittance of visible light of each transparent electrically conductive film obtained. The results were as indicated in Table 11 below. The heating means was a ceramic heater, and the temperature was measured with a thermolabel and thermocouple. The "unheated" in the table indicates Example 17 wherein the temperature of the base was about 35° C.

TABLE 11

| Temperature of Base (°C.) | Surface Resistivity (kΩ/cm²) | Transmittance of Visible Light (%) |
|---|---|---|
| unheated | 11 | 90 |
| 50 | 9.8 | 87 |
| 80 | 9.1 | 82 |
| 100 | 9 | 78 |
| 150 | 8.5 | 65 |
| 200 | 8 | 50 |

As the table shows, the highest transmittance of visible light is achieved with an unheated plastic base, and satisfactory levels of transparency are achieved by heating at a temperature up to 100° C., especially when the base is heated at a temperature up to 80° C.

EXAMPLE 23

A bell jar evacuated to $1 \times 10^{-5}$ mmHg was supplied with wet oxygen gas (RH 95%) until the degree of vacuum was $3 \times 10^{-2}$ mmHg. An evaporation source (0.006 g) of indium and tin (10 wt%) in a tungsten boat was heated at about 700° C. by resistance heating to deposit a film at a rate of 3 Å/sec on a polyester film 100μ thick positioned about 9 cm away from the evaporation source. Then, the remaining part of the evaporation source was deposited on the polyester film by gradually increasing the temperature to about 1,000° C. so as to maintain the deposition rate of 3 Å/sec. This way, two film samples were deposited. Each of the deposited films was 1,000 Å thick, dark brown and opaque. The film had a surface resistivity of 4 kΩ/cm², and a transmittance of visible light of 29%. One sample was heated at 150° C. in air for 60 minutes, and the other was heated at 200° C. for 60 minutes. The resulting two transparent electrically conductive films had surface resistivities of 1.5 kΩ/cm² and 1.6 kΩ/cm², and transmittances of visible light of 75% and 77%, respectively. After storage in air (dark room) for 10 days, the two films had surface resistivities of 1.8 kΩ/cm² and 1.9 kΩ/cm², and the Ro/Rt for the respective films was 0.82 and 0.83. The change in Sn/In ratio from the outer to the inner surface of each film was checked by ESCA, and the results were as obtained in Example 16.

COMPARATIVE EXAMPLE 4

Two transparent electrically conductive films were prepared by repeating the procedure of Example 23 except that the evaporation source was composed of only indium. The films had surface resistivities of 5.6 kΩ/cm² and 2.2 kΩ/cm², and transmittances of visible light of 75% and 77%, respectively. The surface resistivities of the films stored in air (dark room) for 10 days were 9 kΩ/cm² and 3.5 kΩ/cm² and the Ro/Rt for the respective films was 0.62 and 0.63.

While the invention has been described in detail and with reference to specific embodiments thereof, it will be apparent to one skilled in the art that various changes and modifications can be made therein without departing from the spirit and scope thereof.

What is claimed is:

1. A transparent electrically conductive film comprising a metallic oxide, wherein the metallic component comprises from 60 to 95 wt% indium and from 40 to 5 wt% tin, formed on the surface of a plastic base, and wherein the weight ratio of the tin to the indium changes continuously from the outer surface to the inner surface in such a manner that the ratio on the inner surface of the film is appreciably lower than the average ratio of the film and the ratio of the outer surface of the film is appreciably higher than the average ratio of the film.

2. A film as in claim 1 wherein the film has a thickness of from 40 to 10,000 Å, a transmittance of visible light at 600 nm of at least 60%, and a surface resistivity of from 0.01 to $10^5$ kΩ/cm².

3. A film as in claim 2 wherein the thickness is from 40 to 6,000 Å, the transmittance is at least 80%, and the surface resistivity if from 0.1 to 100 kΩ/cm².

4. A film as in claim 3 wherein the thickness is from 60 to 2,000 Å, the transmittance is at least 90%, and the surface resistivity is from 0.1 to 10 kΩ/cm².

5. A film as in claim 1, 2, 3, or 4, wherein the metallic component comprises from 65 to 90 wt% indium and from 35 to 10 wt% tin.

* * * * *